United States Patent
Ting et al.

(10) Patent No.: US 10,559,655 B1
(45) Date of Patent: Feb. 11, 2020

(54) SEMICONDUCTOR DEVICE AND METHOD FOR MANUFACTURING THE SAME

(71) Applicant: UNITED MICROELECTRONICS CORP., Hsinchu (TW)

(72) Inventors: Hsu Ting, Tainan (TW); Chia-Ming Kuo, Kaohsiung (TW); Fu-Jung Chuang, Kaohsiung (TW); Chun-Wei Yu, Tainan (TW); Po-Jen Chuang, Kaohsiung (TW); Yu-Ren Wang, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/210,738

(22) Filed: Dec. 5, 2018

(51) Int. Cl.
| | | |
|---|---|---|
| H01L 29/06 | (2006.01) | |
| H01L 29/66 | (2006.01) | |
| H01L 29/51 | (2006.01) | |
| H01L 21/768 | (2006.01) | |
| H01L 29/78 | (2006.01) | |
| H01L 21/764 | (2006.01) | |

(52) U.S. Cl.
CPC ........ H01L 29/0649 (2013.01); H01L 21/764 (2013.01); H01L 21/76829 (2013.01); H01L 29/511 (2013.01); H01L 29/518 (2013.01); H01L 29/66545 (2013.01); H01L 29/66795 (2013.01); H01L 29/7851 (2013.01)

(58) Field of Classification Search
CPC ........... H01L 29/0649; H01L 21/76829; H01L 21/76264; H01L 29/518
See application file for complete search history.

(56) References Cited

U.S. PATENT DOCUMENTS

| | | |
|---|---|---|
| 5,914,519 A | 6/1999 | Chou et al. |
| 6,238,987 B1 | 5/2001 | Lee |
| 8,421,166 B2 | 4/2013 | Chi et al. |
| 9,252,233 B2 | 2/2016 | Hsiao et al. |
| 9,608,065 B1 | 3/2017 | Bergendahl et al. |
| 9,911,824 B2 | 3/2018 | Ching et al. |
| 10,008,578 B1 | 6/2018 | Lee et al. |
| 10,020,400 B2 | 7/2018 | Cheng et al. |

(Continued)

OTHER PUBLICATIONS

K. Cheng et al., "Air spacer for 10nm FinFET CMOS and beyond," 2016 IEEE International Electron Devices Meeting (IEDM), San Francisco, CA, 2016, pp. 17.1.1-17.1.4. doi: 10.1109/IEDM.2016.7838436.

*Primary Examiner* — Changhyun Yi
(74) *Attorney, Agent, or Firm* — WPAT, PC (57) ABSTRACT

A semiconductor device comprises at least one gate structure disposed on a substrate; a first dielectric layer disposed on the substrate and contacting an outer sidewall of the at least one gate structure; a second dielectric layer having a L shape disposed on the first dielectric layer and contacting the outer sidewall of the at least one gate structure; an etch stop layer contacting the second dielectric layer, the first dielectric layer and the substrate, wherein the second dielectric layer has an upper portion and a lower portion contacting the upper portion, the upper portion extends along the outer sidewall, the lower portion extends from the outer sidewall to the etch stop layer; and an air gap between the second dielectric layer and the etch stop layer; wherein the first dielectric layer and the lower portion of the second dielectric layer have a same width.

18 Claims, 6 Drawing Sheets

(56) References Cited

U.S. PATENT DOCUMENTS

| | | |
|---|---|---|
| 10,021,298 B2 | 7/2018 | Lin |
| 2012/0276711 A1 | 11/2012 | Yoon et al. |
| 2013/0320550 A1* | 12/2013 | Kim .................. H01L 21/76897 257/773 |
| 2015/0014759 A1* | 1/2015 | Lee ..................... H01L 23/5329 257/306 |
| 2015/0061134 A1* | 3/2015 | Lee ....................... H01L 21/764 257/751 |
| 2015/0214220 A1 | 7/2015 | Seo et al. |
| 2015/0262625 A1* | 9/2015 | Han ..................... H01L 21/764 257/773 |
| 2016/0172304 A1* | 6/2016 | Lee ..................... H01L 23/5329 438/655 |
| 2017/0365659 A1 | 12/2017 | Cheng et al. |
| 2018/0226410 A1 | 8/2018 | Chang et al. |

* cited by examiner

SEMICONDUCTOR DEVICE AND METHOD FOR MANUFACTURING THE SAME

TECHNICAL FIELD

The disclosure relates to a semiconductor device and a method for manufacturing the same. More particularly, the disclosure relates to a semiconductor device comprising an air gap and a method for manufacturing the same.

BACKGROUND

With a trend toward scaling down the size of the semiconductor device, FinFET (Field Effect Transistor) devices are more and more popular. During FinFET process, the air gap is usually used as a spacer material to improve the parasite capacitance. However, the method for manufacturing the air gap is too complicated. Therefore, there is a need for developing an improved method for manufacturing the air gap.

SUMMARY OF THE INVENTION

The invention is directed to a semiconductor device and a method for manufacturing the same.

According to one aspect of the present invention, a semiconductor device is provided. The semiconductor device comprises at least one gate structure disposed on a substrate; a first dielectric layer disposed on the substrate and contacting an outer sidewall of the at least one gate structure; a second dielectric layer having a L shape disposed on the first dielectric layer and contacting the outer sidewall of the at least one gate structure; an etch stop layer contacting the second dielectric layer, the first dielectric layer and the substrate, wherein the second dielectric layer has an upper portion and a lower portion contacting the upper portion, the upper portion extends along the outer sidewall, the lower portion extends from the outer sidewall to the etch stop layer; and an air gap between the second dielectric layer and the etch stop layer; wherein the first dielectric layer and the lower portion of the second dielectric layer have a same width.

According to one aspect of the present invention, a method for manufacturing a semiconductor device is provided. The method comprises the following steps. Firstly, at least one gate structure disposed on a substrate is formed. Next, a first dielectric layer disposed on the substrate and contacting an outer sidewall of the at least one gate structure is formed. Then, a second dielectric layer having a L shape disposed on the first dielectric layer and contacting the outer sidewall of the gate structure is formed. Afterwards, an etch stop layer contacting the second dielectric layer, the first dielectric layer and the substrate is formed. The second dielectric layer has an upper portion and a lower portion contacting the upper portion, the upper portion extends along the outer sidewall, the lower portion extends from the outer sidewall to the etch stop layer. Thereafter, an air gap between the second dielectric layer and the etch stop layer. The first dielectric layer and the lower portion of the second dielectric layer have a same width.

The above and other aspects of the invention will become better understood with regard to the following detailed description of the preferred but non-limiting embodiment(s). The following description is made with reference to the accompanying drawings.

DETAILED DESCRIPTION OF THE INVENTION

The procedures and details of the manufacturing method and the structure of the embodiments are for exemplification only, not for limiting the scope of protection of the disclosure. Moreover, the identical or similar elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense. It is to be noted that the drawings are simplified for clearly describing the embodiments, and the details of the structures of the embodiments are for exemplification only, not for limiting the scope of protection of the disclosure. Ones having ordinary skills in the art may modify or change the structures according to the embodiments of the present disclosure.

FIGS. 1-11 are cross-sectional views showing a method for manufacturing a semiconductor device 100 according to an embodiment of the invention.

Figure 1:
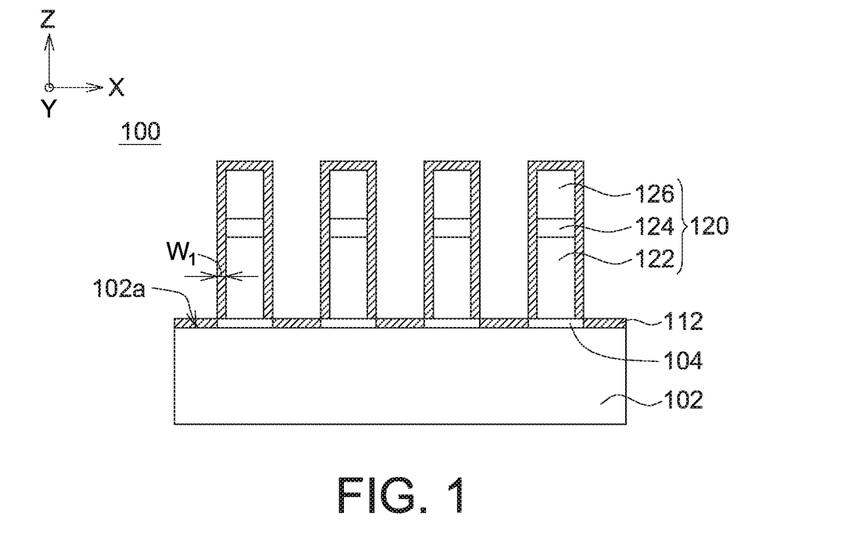
FIGS. 1-11 are cross-sectional views showing a method for manufacturing a semiconductor device according to an embodiment of the invention.

Referring to FIG. 1, a plurality of dummy gate structures 120 may be provided on the substrate 102, and the dummy gate structures 120 are covered by a first dielectric layer 112. The dummy gate structures 120 are separated from each others, and protrude from a top surface 102a of the substrate 102 as a three-dimensional structure. Each of the dummy gate structure 120 comprises a polysilicon layer 122, a first insulating layer 124 and a second insulating layer 126. A gate dielectric layer 104 is disposed between the substrate 102 and the dummy gate structure 120. The first dielectric layer 112 may directly contact the dummy gate structures 120 and the gate dielectric layer 104. The substrate 102 may be a silicon substrate, a silicon-containing substrate, a silicon-on-insulator (SOI) substrate, or the like. The first dielectric layer 112 may comprise a low-k dielectric material, such as SiOCN or other suitable low-k dielectric materials. In one embodiment, the first dielectric layer 112 may have a thickness or a width $W_1$ in a range of 80 to 100 angstroms. The width $W_1$ may be measured in a first direction, e.g. the X-axis direction.

Figure 2:
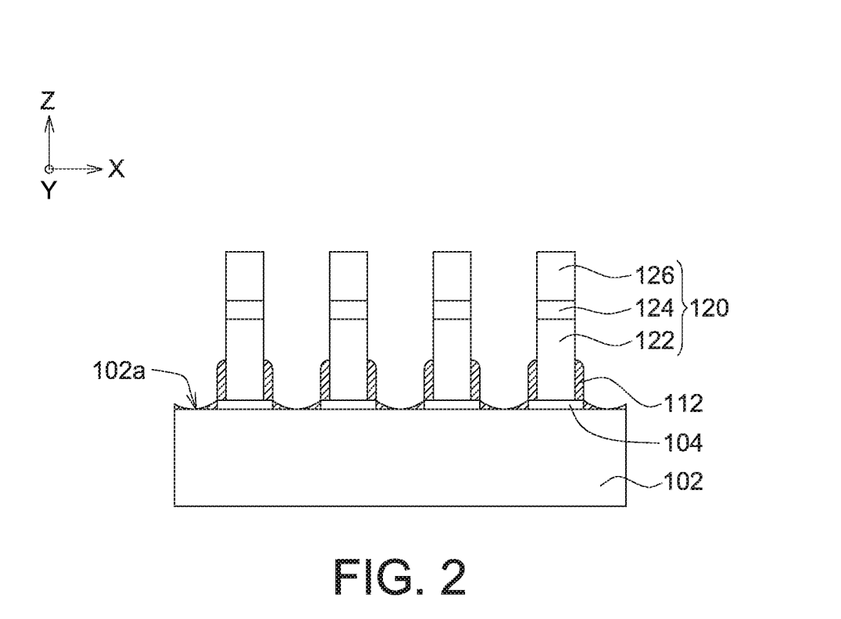

Referring to FIG. 2, a portion of the first dielectric layer 112 may be then removed by an etching process, and a bottom portion of the first dielectric layer 112 is remained after the etching process. The etching process may be a dry etching process. A top portion of the dummy gate structure 120 is exposed from the first dielectric layer 112. A bottom portion of the dummy gate structure 120 is covered by the first dielectric layer 112.

Figure 3:
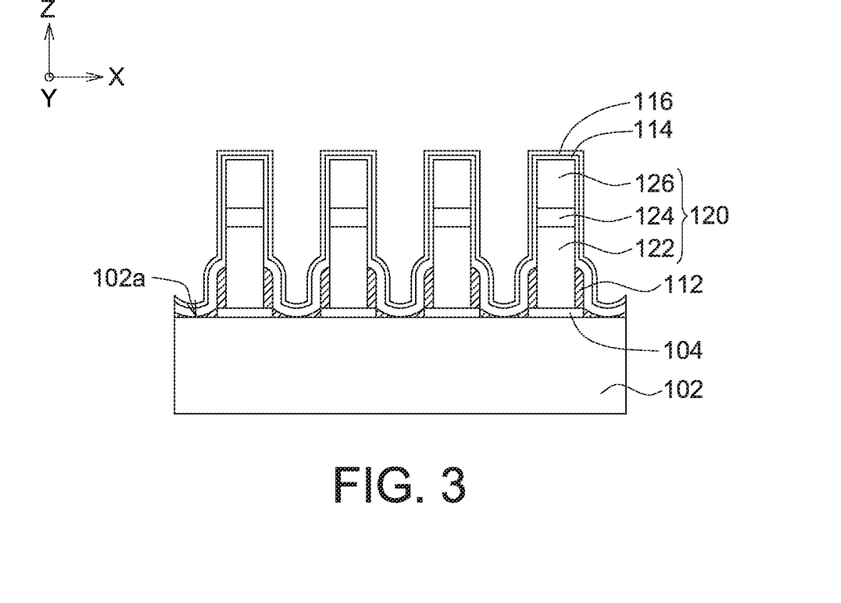

Referring to FIG. 3, a second dielectric layer 114 and a third dielectric layer 116 may be sequentially formed on the first dielectric layer 112 and the dummy gate structure 120. In one embodiment, the second dielectric layer 114 may comprise a nitride material or an oxide material, such as silicon nitricarbide (SiCN), a low-k dielectric material or other suitable material. The third dielectric layer 116 may comprise an ultra low-k dielectric material or silicon nitride (SiN). The second dielectric layer 114 and the third dielectric layer 116 may be formed by a deposition process, such as a Chemical Vapor Deposition (CVD) process, an Atomic Layer Deposition (ALD) process or the like. The second dielectric layer 114 may have a hardness larger than that of the third dielectric layer 116, and may have a hardness equal to or similar to that of the first dielectric layer 112.

Figure 4:
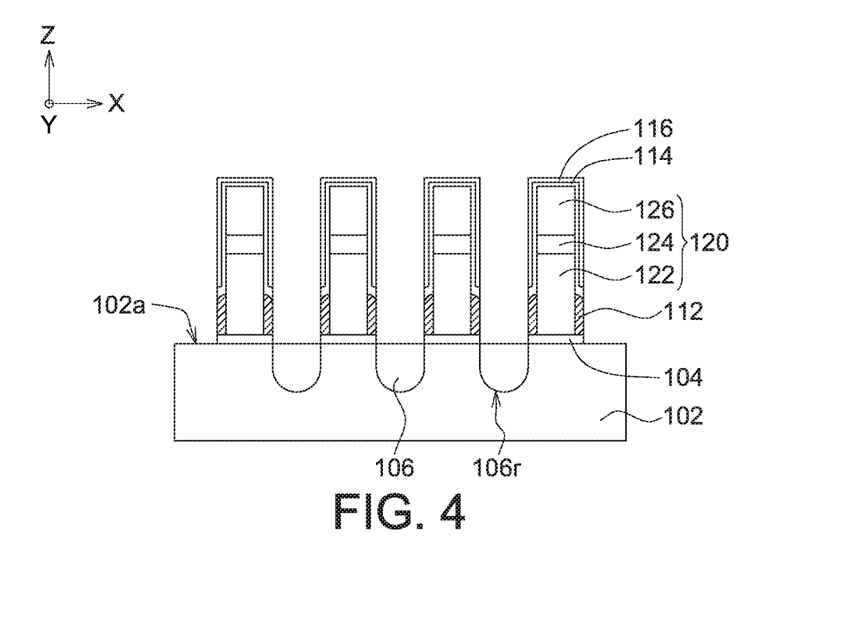

Referring to FIG. 4, portions of the first dielectric layer 112, the second dielectric layer 114 and the third dielectric layer 116 are removed, and a plurality of recesses 106r are formed in the substrates 102. Each of the recesses 106r extends from a top surface 102a of the substrate 102 toward inside of the substrate 102. Then, a plurality of epitaxial semiconductor layers 106 are formed inside the recesses 106r, respectively. In one embodiment, portions of the first dielectric layer 112, the second dielectric layer 114, the third dielectric layer 116 are removed, and the recesses 106r are formed by a dry etching process. The epitaxial semiconductor layers 106 may be formed by an epitaxial process on the substrate 102.

Figure 5:
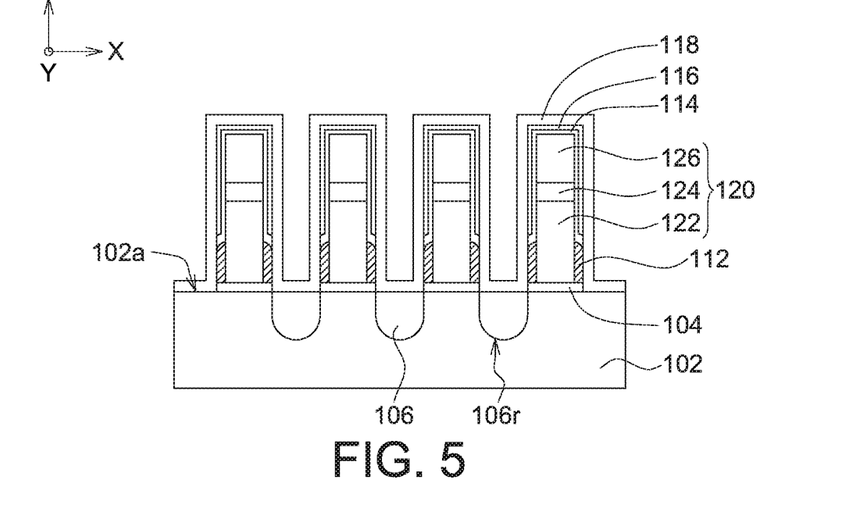

Referring to FIG. 5, an etch stop layer 118 may be formed on and contact the first dielectric layer 112, the second dielectric layer 114, the third dielectric layer 116, the substrate 102 and the epitaxial semiconductor layers 106. In one embodiment, the etch stop layer 118 may be formed by a deposition process, such as a CVD process, an ALD process or the like, and may comprise SiCN.

Figure 6:
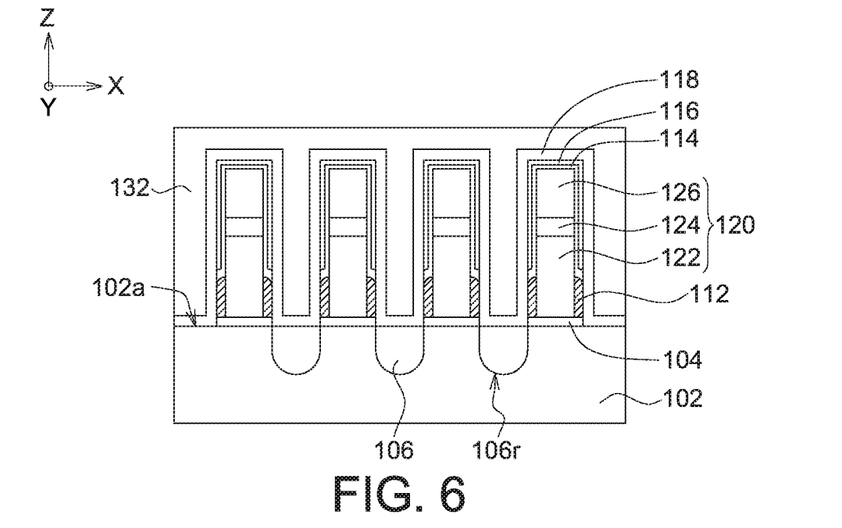

Referring to FIG. 6, an interlayer dielectric layer 132 may be formed on the etch stop layer 118. The interlayer dielectric layer 132 may be formed by a deposition process, such as a CVD process, an ALD process or the like.

Figure 7:
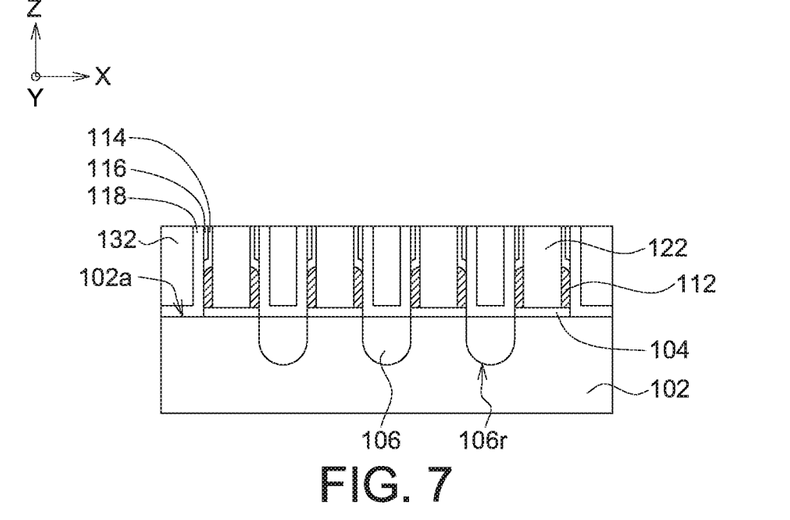

Referring to FIG. 7, portions of the second dielectric layer 114, the etch stop layer 118, the dummy gate structure 120, the interlayer dielectric layer 132, and the third dielectric layer 116 may be removed, and the polysilicon layer 122, the second dielectric layer 114 and the third dielectric layer 116 may be exposed. In one embodiment, the second insulating layer 126 and a portion of the second dielectric layer 114 and the third dielectric layer 116 surrounding and above the second insulating layer 126 are removed by a dry etching process. The first insulating layer 124 and a portion of the second dielectric layer 114 and the third dielectric layer 116 surrounding and above the first insulating layer 124 are removed by a planarization process, such as a chemical mechanical planarization (CMP) process.

Figure 8:
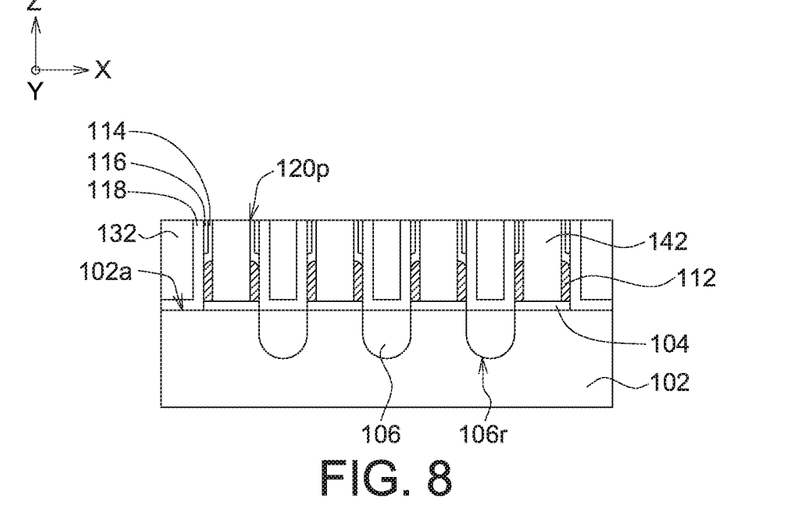

Referring to FIG. 8, the polysilicon layer 122 may be removed to form a first opening 120p, and then a bottom gate 142 is formed in the first opening 120p. The bottom gate 142 may comprise interlayer dielectric materials, high-k dielectric material, work function materials, other suitable material, or a combination thereof. The high-k dielectric material may be $HfO_2$, $HfSiO_4$, HfSiON, $Al_2O_3$, $La_2O_3$, $Ta_2O_5$, $Y_2O_3$, $ZrO_2$, $SrTiO_3$, $ZrSiO_4$, $HfZrO_4$, SBT ($SrBi_2Ta_2O_9$), PZT ($PbZr_xTi_{1-x}O_3$), BST ($Ba_xSr_{1-x}TiO_3$), or the like. The work function materials may be TiN or the like (for p-type semiconductor device), or may be TiAl, TiAlN, or the like (for n-type semiconductor device).

Figure 9:
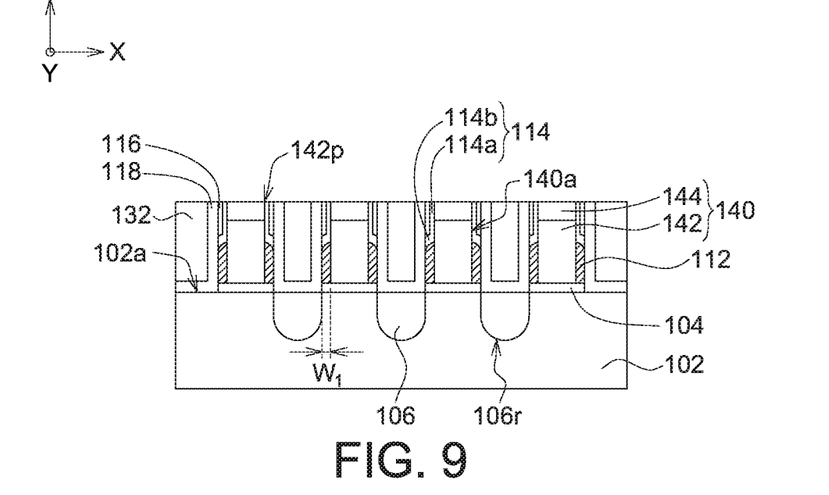

Referring to FIG. 9, an upper portion of the bottom gate 142 may be removed to form a second opening 142p, and then a cap structure 144 is formed in the second opening 142p. In this manner, a gate structure 140 comprising the bottom gate 142 and the cap structure 144 is formed. In one embodiment, the cap structure 144 may comprise nitride, and may be formed by a deposition process. After forming the cap structure 144 in the second opening 142p, a planarization process, such as a chemical mechanical planarization (CMP) process may be performed. In this manner, a plurality of gate structures 140 are formed to protrude from substrate 102. The first dielectric layer 112 disposed on the substrate 102 may contact an outer sidewall 140a of the gate structure 140. The remained second dielectric layer 114 may have a L shape, may be disposed on the first dielectric layer 112 and contact the outer sidewall 140a of the gate structure 140. The second dielectric layer 114 have an upper portion 114a and a lower portion 114b contacting the upper portion 114a. The upper portion 114a extends along the outer sidewall 140a of the gate structure 140. The lower portion 114b extends from the outer sidewall 140a of the gate structure 140 to the etch stop layer 118. The first dielectric layer 112 and the lower portion of the second dielectric layer 114 may have a same width $W_1$.

Figure 10:
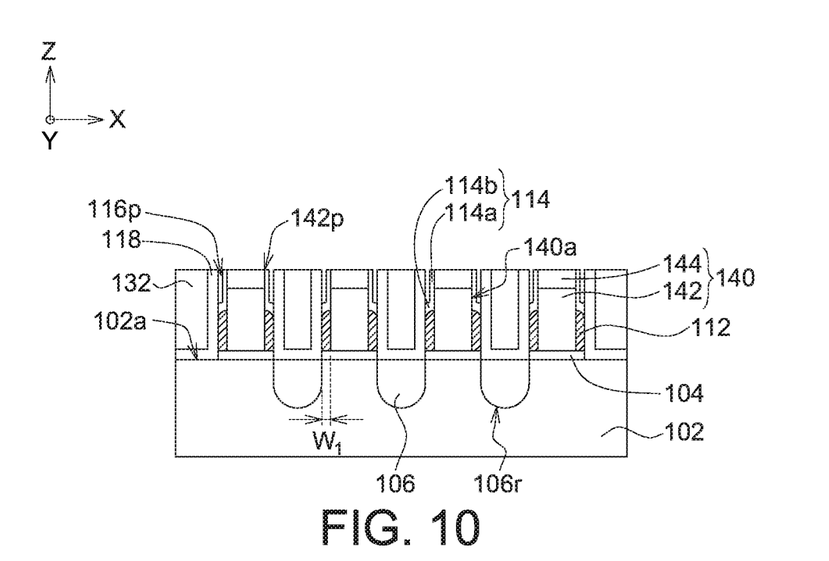

Referring to FIG. 10, the third dielectric layer 116 may be removed by an etching process, such as a dry etching process or a wet etching process, to form a gap 116p between the second dielectric layer 114 and the etch stop layer 118. In the etching process, an etchant may have a first etching rate and a second etching rate to the second dielectric layer 114 and the third dielectric layer 116, respectively, and the second etching rate is larger than the first etching rate. In one embodiment, the second etching rate is 10 times larger than the first etching rate. That is, the etchant may have a high selectivity to etch the third dielectric layer 116 than the second dielectric layer 114, and the second dielectric layer 114 having a L shape may be remained intact. In one embodiment, the etchant can be diluted HF, $H_3PO_4$ or other suitable etchant that selectively etches the third dielectric layer 116.

Since the outer sidewall 140a of the gate structure 140 and a portion of structures on the substrate 102 (e.g. a portion of the gate dielectric layer 104, a fin structure or other suitable structures) are covered by the second dielectric layer 114 and the first dielectric layer 112, the gate structure 140 and a portion of the structure disposed on the substrate 102 can be protected from damaging during the etching process to form the gap 116p. Further, since the first dielectric layer 112 and the bottom portion 114b of the second dielectric layer 114 have a same width $W_1$, the thickness of the first dielectric layer 112 is large enough to protect the gate structure 140 and a portion of the structure disposed on the substrate 102 (e.g. a portion of the gate dielectric layer 104, a fin structure or other suitable structures) during the etching process.

Figure 11:
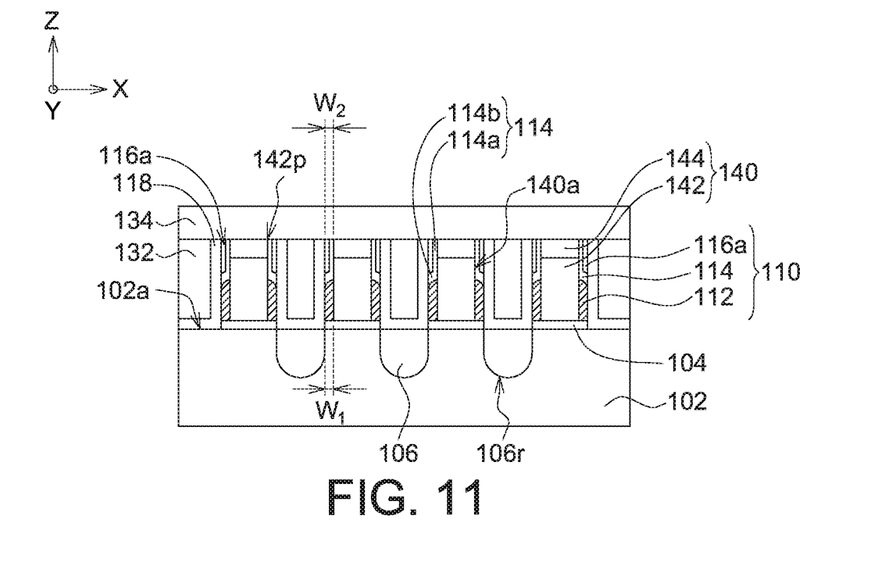

Referring to FIG. 11, a top dielectric layer 134 may be formed on and contact the second dielectric layer 114, the etch stop layer 118, the interlayer dielectric layer 132 and the gate structure 140, and the gap 116p sealed by the top dielectric layer 134 turns out to be an air gap 116a. In other words, the air gap 116a is disposed between the second dielectric layer 114, the etch stop layer 118 and the top dielectric layer 134. In one embodiment, the top dielectric layer 134 may be formed by a deposition process and comprise dielectric materials, such as tetraethoxysilane (TEOS). The etch stop layer 118 extends along the air gap 116a, the second dielectric layer 114, the first dielectric layer 112 to the top surface 102a of the substrate 102 and covers the epitaxial semiconductor layer 106. A sum of the upper portion 114a of the second dielectric layer 114 and the air gap has a second width $W_2$, and the first width $W_1$ may be similar or equal to the second width $W_2$.

In this manner, the air gap 116a can be simply formed by using an etching process with different etching rate to the second dielectric layer 114 and the second dielectric layer 116. The process flow of the present invention can be more simplified than a comparative example without using a different etching rate to form an air gap. The semiconductor device 100 having the air gap 116a can have an improved parasitic capacitance in comparison to a comparative example without using the air gap as a spacer material.

In the present invention, since the second dielectric layer 114 having a L shape is disposed on the first dielectric layer 112 and contacts he outer sidewall 140a of the gate structure 140, the gate structure 140 can be protected from damaging while manufacturing, such as the etching process to form the air gap 116a. The first dielectric layer 112 disposed on the substrate 102 and contacting the outer sidewall 140a of the gate structure 140 can also protect the gate structure 140 from damaging while manufacturing, such as the etching process to form the air gap 116a. Further, since the first dielectric layer 112 and the bottom portion 114b of the second dielectric layer 114 have a same width $W_1$, the thickness of the first dielectric layer 112 is large enough to protect the gate structure 140 and a portion of the structure disposed on the substrate 102 (e.g. e.g. a portion of the gate dielectric layer 104, a fin structure or other suitable structures) during the etching process. Therefore, the semiconductor device of the present invention can be formed in a more simple way in comparison to the conventional process for forming an air gap, and the structure of the semiconductor device can be well protected during manufacturing, so as to obtain the semiconductor device having an improved performance.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   at least one gate structure disposed on a substrate;
   a first dielectric layer disposed on the substrate and contacting an outer sidewall of the at least one gate structure;
   a second dielectric layer having a L shape disposed on the first dielectric layer and contacting the outer sidewall of the gate structure;
   an etch stop layer contacting the second dielectric layer, the first dielectric layer and the substrate, wherein the second dielectric layer has an upper portion and a lower portion contacting the upper portion, the upper portion extends along the outer sidewall, the lower portion extends from the outer sidewall to the etch stop layer; and
   an air gap disposed between the second dielectric layer and the etch stop layer;
   wherein the first dielectric layer and the lower portion of the second dielectric layer have a same width;
   wherein the lower portion of the second dielectric layer has a first width, a sum of the upper portion of the second dielectric layer and the air gap has a second width, and the first width equals to the second width.

2. The semiconductor device according to claim 1, wherein the first dielectric layer has a width in a range of 80 to 100 angstroms.

3. The semiconductor device according to claim 1, further comprising a top dielectric layer covering the second dielectric layer, the etch stop layer and the at least one gate structure, and the air gap is sealed between the top dielectric layer, the second dielectric layer and the etch stop layer.

4. The semiconductor device according to claim 1, wherein the first dielectric layer comprises a low-k dielectric material.

5. The semiconductor device according to claim 1, wherein the second dielectric layer comprises silicon nitricarbide (SiCN) or a low-k dielectric material.

6. The semiconductor device according to claim 1, further comprising an epitaxial semiconductor layer formed inside a recess in the substrate, wherein the recess extends from a top surface of the substrate toward inside of the substrate.

7. The semiconductor device according to claim 6, wherein the etch stop layer extends along the air gap, the second dielectric layer, the first dielectric layer to the top surface of the substrate and covers the epitaxial semiconductor layer.

8. A method for manufacturing a semiconductor device, comprising:
   forming at least one gate structure disposed on a substrate;
   forming a first dielectric layer disposed on the substrate and contacting an outer sidewall of the at least one gate structure;
   forming a second dielectric layer having a L shape disposed on the first dielectric layer and contacting the outer sidewall of the at least one gate structure;
   forming an etch stop layer contacting the second dielectric layer, the first dielectric layer and the substrate, wherein the second dielectric layer has an upper portion and a lower portion contacting the upper portion, the upper portion extends along the outer sidewall, the lower portion extends from the outer sidewall to the etch stop layer; and
   forming an air gap between the second dielectric layer and the etch stop layer;
   wherein the first dielectric layer and the lower portion of the second dielectric layer have a same width;
   wherein the lower portion of the second dielectric layer has a first width, a sum of the upper portion of the second dielectric layer and the air gap has a second width, and the first width equals to the second width.

9. The method according to claim 8, wherein the steps for forming the air gap comprising:
   forming a third dielectric layer disposed on the second dielectric layer before the step for forming the etch stop layer;
   removing the third dielectric layer to form a gap between the second dielectric layer and the etch stop layer;
   forming a top dielectric layer covering the second dielectric layer, the gap, and the etch stop layer to form the air gap sealed between the second dielectric layer, the etch stop layer and the top dielectric layer.

10. The method according to claim 9, wherein the third dielectric layer is removed by an etchant, the etchant has a first etching rate and a second etching rate to the second dielectric layer and the third dielectric layer, respectively, and the second etching rate is larger than the first etching rate.

11. The method according to claim 10, wherein the second etching rate is 10 times larger than the first etching rate.

12. The method according to claim 9, wherein the second dielectric layer has a hardness larger than that of the third dielectric layer.

13. The method according to claim 12, wherein the second dielectric layer comprises silicon nitricarbide (SiCN) or a low-k dielectric material, and the third dielectric layer comprises an ultra low-k dielectric material or silicon nitride (SiN).

14. The method according to claim 8, wherein the step for forming the at least one gate structure comprising:
- forming at least one dummy gate structure disposed on the substrate, wherein the at least one dummy gate structure comprising a polysilicon layer, a first insulating layer and a second insulating layer sequentially stacked on the substrate;
- forming an interlayer dielectric layer on the etch stop layer; removing the at least one dummy gate structure to form a first opening;
- forming a bottom gate in the first opening; removing a portion of the bottom gate to form a second opening;
- forming a cap structure in the second opening, so as to form the at least one gate structure comprising the bottom gate and the cap structure.

15. The method according to claim 8, wherein the first dielectric layer has a width in a range of 80 to 100 angstroms.

16. The method according to claim 8, wherein the first dielectric layer comprises a low-k dielectric material.

17. The method according to claim 8, further comprising:
- forming a recess in the substrate, wherein the recess extend from a top surface of the substrate toward inside of the substrate;
- forming an epitaxial semiconductor layer inside the recess.

18. The method according to claim 17, wherein the etch stop layer extends along the air gap, the second dielectric layer, the first dielectric layer to the top surface of the substrate and covers the epitaxial semiconductor layer.

* * * * *